(12) United States Patent
Cheng et al.

(10) Patent No.: US 11,424,321 B2
(45) Date of Patent: Aug. 23, 2022

(54) SEMICONDUCTOR STRUCTURE AND PREPARATION METHOD THEREOF

(71) Applicant: ENKRIS SEMICONDUCTOR, INC., Suzhou (CN)

(72) Inventors: Kai Cheng, Suzhou (CN); Kai Liu, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 45 days.

(21) Appl. No.: 17/195,893

(22) Filed: Mar. 9, 2021

(65) Prior Publication Data
US 2021/0193794 A1 Jun. 24, 2021

Related U.S. Application Data

(63) Continuation of application No. PCT/CN2020/076122, filed on Feb. 21, 2020.

(30) Foreign Application Priority Data

Feb. 26, 2019 (CN) .......................... 201910143592.5

(51) Int. Cl.
*H01L 29/66* (2006.01)
*H01L 29/06* (2006.01)
*H01L 29/207* (2006.01)
*H01L 29/778* (2006.01)

(52) U.S. Cl.
CPC ........ *H01L 29/0615* (2013.01); *H01L 29/207* (2013.01); *H01L 29/66462* (2013.01); *H01L 29/7786* (2013.01)

(58) Field of Classification Search
None
See application file for complete search history.

(56) References Cited

U.S. PATENT DOCUMENTS

| 10,672,763 B2 * | 6/2020 | Jiang ................... H01L 27/0605 |
| 2015/0076449 A1 * | 3/2015 | Yamada .............. H01L 29/7787 257/20 |
| 2015/0090957 A1 * | 4/2015 | Tomabechi ....... H01L 29/66462 438/285 |
| 2016/0315179 A1 * | 10/2016 | Nishimori ............... H03F 3/245 |

* cited by examiner

*Primary Examiner* — Bilkis Jahan
(74) *Attorney, Agent, or Firm* — Westbridge IP LLC

(57) ABSTRACT

The present invention provides a semiconductor structure and a preparation method thereof. A transition metal and an impurity are co-doped on a buffer layer above a substrate layer to reduce the leakage current of a semiconductor device, to improve the pinch-off behavior, and to avoid the device current collapse, moreover, the ranges of the concentration of the transition metal and the impurity in the buffer layer are controlled to ensure the balance of the leakage current during the dynamic characteristics of the device.

11 Claims, 4 Drawing Sheets

SEMICONDUCTOR STRUCTURE AND PREPARATION METHOD THEREOF

CROSS-REFERENCE TO RELATED APPLICATIONS

This application is a continuation of International Application No. PCT/CN2020/076122, filed on Feb. 21, 2020, which claims priority to Chinese Patent Application No. 201910143592.5, filed on Feb. 26, 2019. The disclosures of the aforementioned applications are hereby incorporated by reference in their entireties.

TECHNICAL FIELD

The present invention relates to the technical field of microelectronics, particularly relates to a semiconductor structure and a preparation method thereof.

BACKGROUND

A High Electron Mobility Transistor (HEMT) is a heterojunction field effect transistor. Taking an AlGaN/GaN HEMT structure as an example, the band gap of AlGaN is larger than that of GaN, and when they form a heterojunction, two-dimensional electron gas (2DEG) is formed at the interface of AlGaN and GaN. Therefore, the HEMT is also called a 2DEG field effect transistor.

For a GaN-based HEMT, doping a transition metal such as iron or other impurity into a region located below the 2DEG can improve the pinch-off behavior or increase the cut-off voltage. However, the formation of 2DEG is hindered by electrons trapped by a charge trap composed of impurity, which makes the generation of current collapse easily. Although reducing the doping concentration of impurity is beneficial to suppress current collapse, the current collapse still cannot be eliminated if a thickness of a buffer layer cannot be accurately adjusted and controlled.

SUMMARY

In view of this, there is an urgent need to propose a semiconductor structure and its preparation method, which can suppress the leakage current and improve the pinch-off behavior of a device while avoiding current collapse, so that the leakage current of the device using this semiconductor structure keeps balance during dynamic characteristics.

The present invention provides a semiconductor structure comprising:

a substrate; and a buffer layer formed on the substrate, wherein the buffer layer comprises a first buffer layer and a second buffer layer sequentially upwards from the substrate;

wherein the first buffer layer and the second buffer layer are co-doped with a transition metal and an impurity;

wherein in the first buffer layer, a concentration of the transition metal is $1\times10^{16}$ cm$^{-3}$~$1\times10^{20}$ cm$^{-3}$, and a doping concentration of the impurity is greater than $3\times10^{15}$ cm$^{-3}$ and less than the doping concentration of the transition metal;

wherein a concentration of the transition metal in the second buffer layer gradually decreases, and the doping concentration of the transition metal drops to 0.5~2 times of a background concentration at a distance greater than or equal to 100 nm from an upper surface of the second buffer layer away from the substrate;

wherein in the second buffer layer, a doping concentration of the impurity is not greater than the doping concentration of the transition metal; and wherein a thickness of the first buffer layer is not greater than 5 μm, and a thickness of the second buffer layer is not less than 0.2 μm.

Moreover, the semiconductor structure comprises a nucleation layer disposed between the substrate and the buffer layer, wherein a material of the nucleation layer is at least one of AlN, GaN and AlGaN.

The present invention provides a method for preparing a semiconductor structure, comprising:

providing a substrate; and preparing a buffer layer on the substrate, wherein the buffer layer comprises a first buffer layer and a second buffer layer sequentially upwards from the substrate;

wherein the first buffer layer and the second buffer layer are co-doped with a transition metal and an impurity;

wherein in the first buffer layer, a concentration of the transition metal is $1\times10^{16}$ cm$^{-3}$~$1\times10^{20}$ cm$^{-3}$, and a doping concentration of the impurity is greater than $3\times10^{15}$ cm$^{-3}$ and less than the doping concentration of the transition metal;

wherein a concentration of the transition metal in the second buffer layer gradually decreases, and the concentration of the transition metal drops to 0.5~2 times of a background concentration at a distance greater than or equal to 100 nm from an upper surface of the second buffer layer away from the substrate;

wherein in the second buffer layer, a doping concentration of the impurity is not greater than the doping concentration of the transition metal; and wherein a thickness of the first buffer layer is not greater than 5 μm, and a thickness of the second buffer layer is not less than 0.2 μm.

In an embodiment of the invention, the method for preparing the semiconductor structure further comprises providing a nucleation layer, wherein a material of the nucleation layer is at least one of AlN, GaN and AlGaN.

Moreover, the preparation method can be prepared by atomic layer deposition (ALD), chemical vapor deposition (CVD), molecular beam epitaxy (MBE), plasma enhanced chemical vapor deposition (PECVD), low pressure chemical vapor deposition (LPCVD), metal-organic chemical vapor deposition (MOCVD), or a combination thereof.

In the invention, doping transition metal into the first buffer layer can make the first buffer layer form a deep acceptor level as an electron trap, which traps free electrons and effectively avoids the diffusion of the free electrons toward the substrate; where the upper surface is greater than or equal to 100 nm, the transition metal concentration drops to 0.5-2 times of a background concentration, and the concentration of the transition metal at the distance greater than or equal to 100 nm from the upper surface of the second buffer layer should not be too low, otherwise the breakdown voltage of the HEMT device will be smaller; and also that should not be too high, which can avoid the smearing effect of the transition metal and prevent the current collapse; in addition, the impurity co-doped in the buffer layer makes the impurity to become an acceptor impurity, which can compensate for the background electron and reduce the background concentration in the semiconductor structure; which can enable the device using the semiconductor structure to reduce the leakage current and improve the pinch-off behavior.

DETAILED DESCRIPTION OF THE EMBODIMENTS

Embodiments according to the present invention are explained in detail with reference to the drawings. But these embodiments to be given below should not be interpreted as limiting the invention. The changes of structure, method, or function made by those of ordinary skill in the art according to these embodiments are all in the protection scope of the present invention.

In addition, repeated reference numbers or labels may be used in different embodiments, which is only used to describe the invention simply and clearly, but do not represent any correlation between the different embodiments and/or structures discussed.

The invention provides a method for preparing a semiconductor structure, comprising:

providing a substrate 1; and preparing a buffer layer 3 on the substrate, wherein the buffer layer 3 comprises a first buffer layer 31 and a second buffer layer 32, wherein a thickness of the first buffer layer 31 is not greater than 5 µm, and a thickness of the second buffer layer 32 is not less than 0.2 µm;

wherein the substrate 1 may be a semiconductor material, a ceramic material, or a polymer material, such as sapphire, silicon carbide, silicon, lithium niobate, silicon on insulating substrate (SOI), gallium nitride, aluminum nitride.

Figure 2:
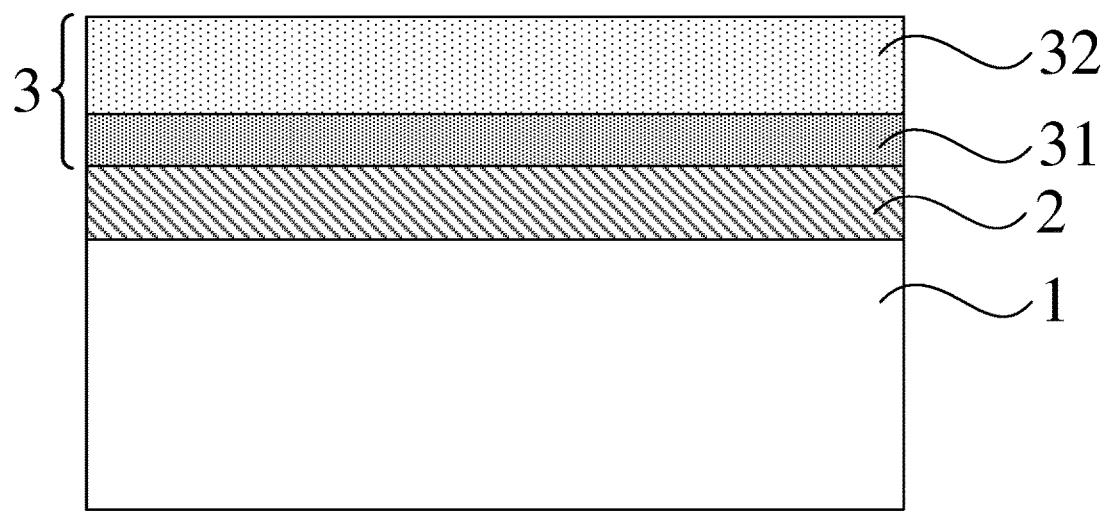
FIG. 2 is a semiconductor structure according to another embodiment of the invention.

Furthermore, the method for preparing a semiconductor structure comprises providing a nucleation layer 2 disposed between the substrate 1 and the buffer layer 3 as shown in FIG. 2, wherein a material of the nucleation layer is at least one of AlN, GaN and AlGaN.

The materials of the substrate 1 and the nucleation layer 2 can be adjusted according to actual application requirement, which there is not any limitation on in the invention.

In the embodiment, the first buffer layer 31 and the second buffer layer 32 are co-doped with a transition metal and an impurity; a doping concentration of the transition metal in the first buffer layer 31 is $1 \times 10^{16}$ cm$^{-3}$~$1 \times 10^{20}$ cm$^{-3}$. A doping concentration of the impurity is greater than $3 \times 10^{15}$ cm$^{-3}$ and less than the doping concentration of the transition metal.

In the embodiment, a concentration of the transition metal in the second buffer layer 32 gradually decreases toward the direction away from the substrate. The concentration of the transition metal drops to 0.5~2 times of a background concentration at a distance greater than or equal to 100 nm from an upper surface of the second buffer layer 32 away from the substrate 1.

The transition metal is at least one of Ti, Cr, Mn, Fe, Co, Ni, Cu, Zn, Mo, Ag, and Cd, preferably Fe, and the impurity is C.

It should be noted that in the process of providing the semiconductor structure, even if the buffer layer and other epitaxial layers are not deliberately doped, there are still C, O, Fe or other contaminants in the formed semiconductor structure. The concentration of the contaminants caused by the preparation environment is called background concentration. In the embodiment, the background concentrations of C, O, and Fe are all less than $1 \times 10^{16}$ cm$^{-3}$.

Moreover, in the second buffer layer 32, a doping concentration of the impurity is not greater than the doping concentration of the transition metal.

Figure 1:
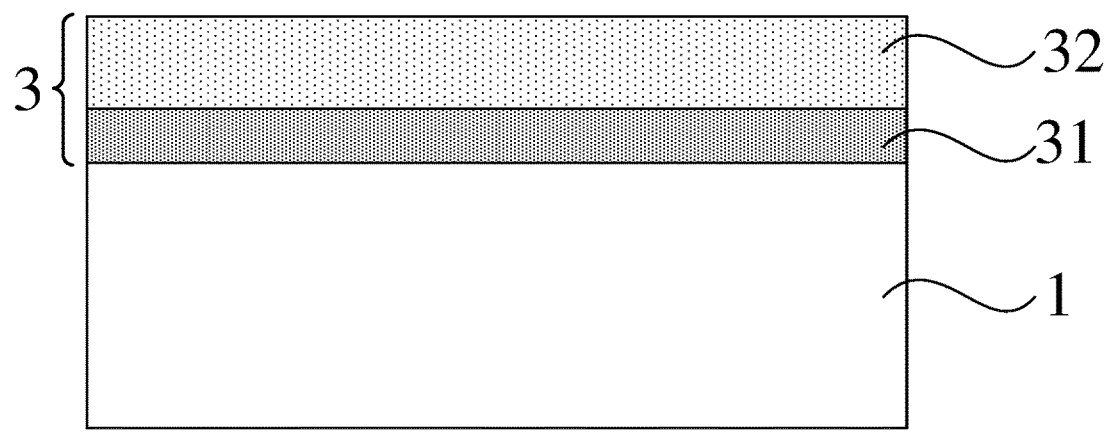
FIG. 1 is a schematic diagram of a semiconductor structure according to an embodiment of the invention.

The invention also provides a semiconductor structure, as shown in FIG. 1, comprising:

substrate 1, wherein the substrate 1 comprises a semiconductor material, a ceramic material, or a polymer material, preferably sapphire, silicon carbide, silicon, lithium niobate, silicon insulator (SOI), gallium nitride, and aluminum nitride;

a buffer layer 3 formed on the substrate 1, wherein the buffer layer 3 comprises a first buffer layer 31 and a second buffer layer 32 sequentially upwards from the substrate 1; wherein a thickness of the first buffer layer 31 is not greater than 5 µm, and a thickness of the second buffer layer 32 is not less than 0.2 µm.

Moreover, the first buffer layer 31 and the second buffer layer 32 are co-doped with a transition metal and an impurity; wherein a doping concentration of the transition metal in the first buffer layer 31 is $1 \times 10^{16}$ cm$^{-3}$~$1 \times 10^{20}$ cm$^{-3}$; and a doping concentration of the impurity is greater than $3 \times 10^{15}$ cm$^{-3}$ and less than the doping concentration of the transition metal.

Moreover, a concentration of the transition metal in the second buffer layer 32 gradually decreases toward the direction away from the substrate. The concentration of the transition metal drops to 0.5~2 times of a background concentration at a distance greater than or equal to 100 nm from an upper surface of the second buffer layer 32 away from the substrate 1.

The transition metal is at least one of Ti, Cr, Mn, Fe, Co, Ni, Cu, Zn, Mo, Ag, and Cd, preferably Fe, and the impurity is C.

Moreover, in the second buffer layer 32, a doping concentration of the impurity is not greater than the doping concentration of the transition metal.

Moreover, as shown in FIG. 2, the semiconductor structure comprises a nucleation layer 2 disposed between the substrate 1 and the buffer layer 3. Wherein a material of the nucleation layer 2 is at least one of AlN, GaN and AlGaN.

The semiconductor structure proposed by the invention can be applied to a variety of device structures, such as high electron mobility transistors, high electron mobility transistors made of aluminum gallium indium nitride/gallium nitride heterostructure, high mobility triode made of aluminum nitride/gallium nitride heterostructure, gallium nitride MOSFET, LED, photodetector, hydrogen generator, or solar cell. For example, when we apply it to an LED device, a light emitting structure can be prepared on the semiconductor structure; when we applied it to a HEMT device, a heterojunction structure can be epitaxially grown on the semiconductor structure, as shown in FIG. 3.

Figure 3:
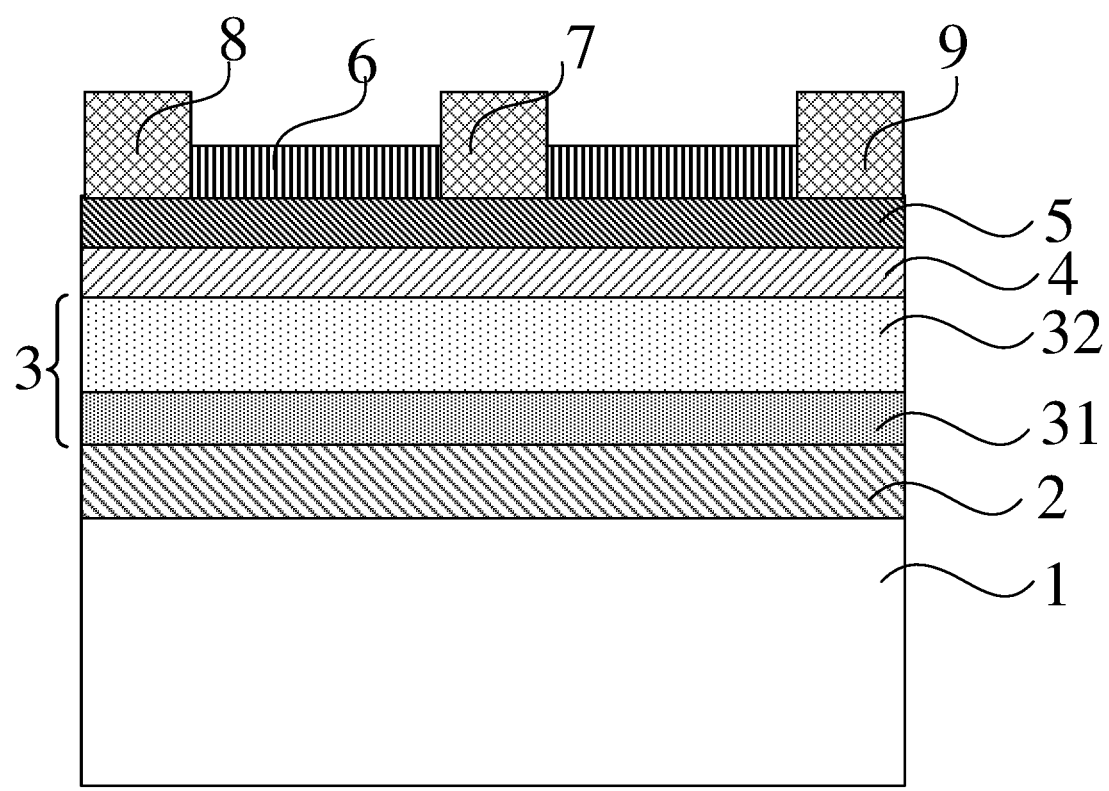
FIG. 3 is a schematic diagram of a semiconductor structure of the invention applied to a HEMT device.

FIG. 3 shows a schematic diagram of the semiconductor structure applied to a HEMT device structure, wherein the HEMT device comprises: a substrate 1, a nucleation layer 2, a buffer layer 3, a channel layer 4, a barrier layer 5, a passivation layer 6, a gate 7, a source 8, a drain 9. Wherein the buffer layer 3 comprises a first buffer layer 31 and a second buffer layer 32.

In the embodiment, the substrate 1 may be a Si substrate, and in other embodiments, the substrate 1 may also be a sapphire substrate or a SiC substrate.

In the embodiment, the nucleation layer 2 may be AlN; the buffer layer 3 may be AlGaN; the channel layer 4 may be GaN; and the barrier layer 5 may be AlGaN.

In the embodiment, the passivation layer 6 may comprise silicon nitride, silicon dioxide, aluminum nitride, aluminum oxide, aluminum oxynitride, and so on.

In the embodiment, the source 8 and the drain 9 are in Ohmic contact with the barrier layer 5, and the gate 7 is in Schottky contact with the passivation layer 6.

In the embodiment, the thickness of the first buffer layer 31 is 300 nm. The thickness of the second buffer layer 32 is 600 nm. The thickness of the channel layer 4 is 300 nm. The first buffer layer 31 and the second buffer layer 32 are co-doped with the transition metal Fe and C.

Figure 4A:
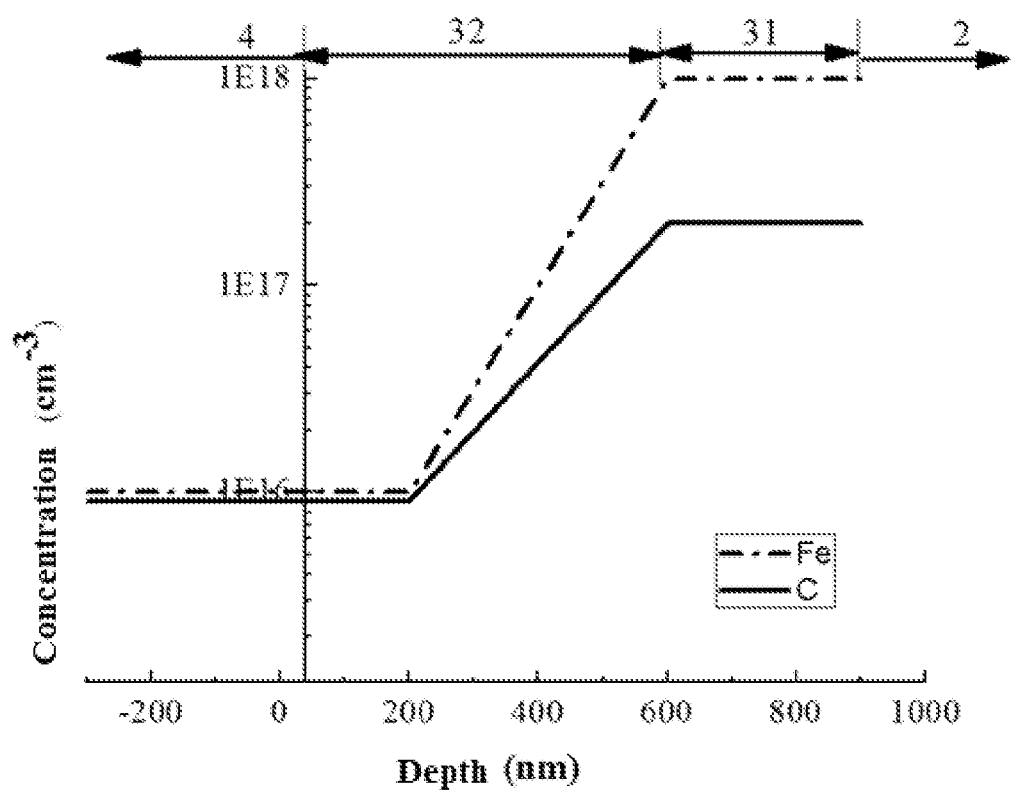
FIGS. 4a-4b are the doping methods of the transition metal concentration and the impurity concentration in a semiconductor structure of the invention relative to the depth variations.

Specifically, as shown in FIG. 4a, a thickness of the semiconductor layer is represented by an abscissa, and the upper surface of the second buffer layer 32 is taken as 0 nm, wherein the upper surface of the second buffer layer 32 is the surface of the second buffer layer 32 away from the substrate 1. The concentration of doping atom is indicated by the ordinate. In this embodiment, the direction of the negative axis of the abscissa is a direction towards the channel layer 4. The second buffer layer 32 is between 0 nm-600 nm, the first buffer layer 31 is between 600 nm-900 nm, and the direction of the nucleation layer 2 is greater than 900 nm. As shown in FIG. 4a, a doping concentration of Fe in the first buffer layer 31 (600 nm-900 nm) is $1\times10^{18}$ cm$^{-3}$, and a doping concentration of C is less than that of Fe, which is $1\times10^{17}$ cm$^{-3}$; a doping concentration of Fe in the second buffer layer 32 (200 nm-600 nm) gradually decreases, and at a distance of 200 nm from the junction of the channel layer 4 and the second buffer layer 32 (that is, the position of the abscissa at 200 nm), and a doping concentration of Fe decreases $1\times10^{16}$ cm$^{-3}$; and a doping concentration of C in the second buffer layer gradually decreases and is less than the doping concentration of Fe, and at a distance of 200 nm from the junction of the channel layer 4 and the second buffer layer 32 (that is, the position of the abscissa at 200 nm), a doping concentration of C is reduced to $9\times10^{15}$ cm$^3$.

In FIG. 4a, the doping concentration of Fe and C in the second buffer layer 32 decrease linearly. In other embodiments, the doping concentration of Fe and C in the second buffer layer 32 may be a non-linear decrease; as long as at the distance of greater than or equal to 100 nm from the upper surface of the second buffer layer 32, the concentration of the transition metal drops to 0.5 to 2 times of the background concentration.

It can be understood that it will affect the decreasing slope of the transition metal and the minimum concentration of the transition metal in the buffer layer which includes the temperature of the preparation environment, the thickness of the buffer layer, the bond energy of the doped transition metal, the diffusion activation energy in the doped buffer layer, the metal doping method, and the dislocation density between the buffer layer and the substrate layer.

Figure 4B:
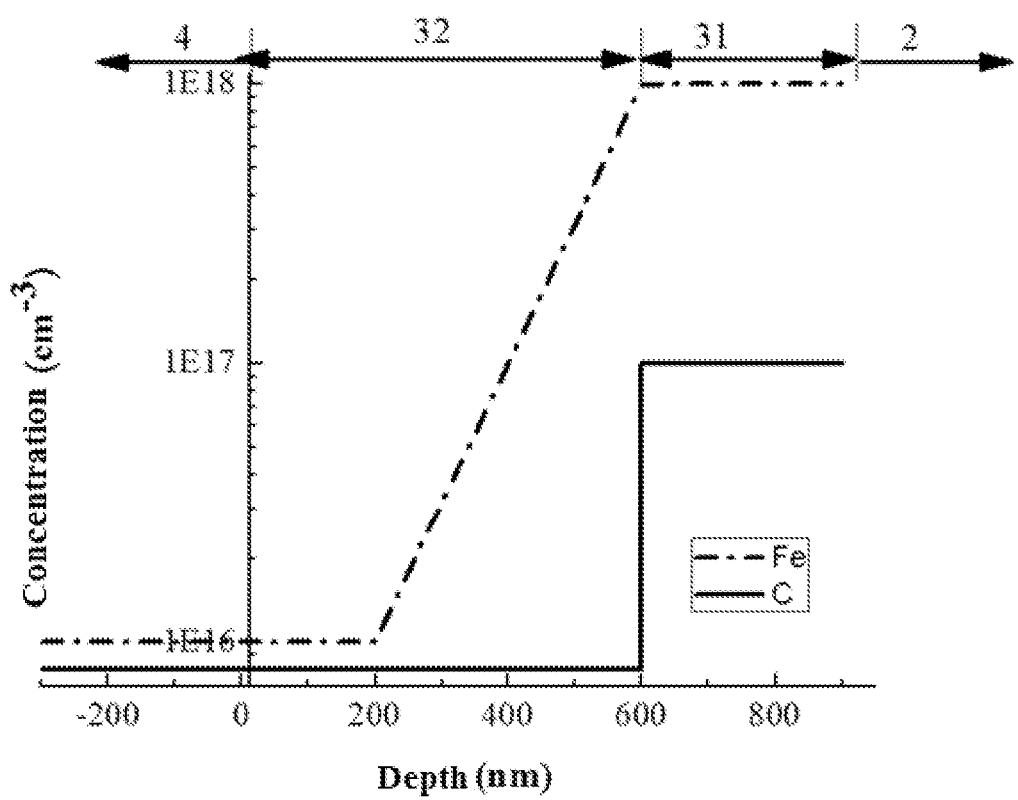

In an embodiment of FIG. 4a, a doping concentration of C in the second buffer layer 32 gradually decreases. In other embodiments, a doping concentration of C in the second buffer layer 32 may be constant, as long as the doping concentration of C is ensured less than the doping concentration of Fe. As shown in FIG. 4b, a doping concentration of C in the first buffer layer is $1\times10^{17}$ cm$^{-3}$, which in the second buffer layer is $8\times10^{15}$ cm$^{-3}$. Both the doping concentration of C in the first buffer layer and the doping concentration of C in the second buffer layer remain constant.

In the invention, the doping transition metal in the first buffer layer can make the first buffer layer form a deep acceptor level as an electron trap, which traps free electrons and effectively avoids the diffusion of the free electrons toward the substrate. At the distance greater than or equal to 100 nm from the upper surface of the second buffer layer, the transition metal concentration drops to 0.5~2 times of a background concentration. The concentration of the transition metal at the distance greater than or equal to 100 nm from the upper surface of the second buffer layer should not be too low, otherwise the breakdown voltage of the HEMT device will be smaller. The concentration of the transition metal at the distance greater than or equal to 100 nm from the upper surface of the second buffer layer also should not be too high, which can avoid the smearing effect of the transition metal and prevent the current collapse. In addition, the impurity co-doped in the buffer layer makes the impurity to become an acceptor impurity, which can compensate for the background electron and reduce the background concentration in the semiconductor structure. So that the device using the semiconductor structure realizes reduction of the leakage current and improvement of the pinch-off behavior.

Moreover, the semiconductor can be prepared by atomic layer deposition (ALD), chemical vapor deposition (CVD), molecular beam epitaxy (MBE), plasma enhanced chemical vapor deposition (PECVD), low pressure chemical vapor deposition (LPCVD), Physical Vapor Deposition (PVD), metal-organic molecular beam epitaxy (MOMBE), metal-organic chemical vapor deposition (MOCVD), or a combination thereof.

It should be understood that although this specification is described in accordance with the embodiments, not each embodiment only contains an independent technical solution, and this narration of the specification is only for clarity, and those skilled in the art should regard the specification as a whole, and the technical solutions in the embodiments can also be appropriately combined to form other embodiments that can be understood by those skilled in the art.

The series of detailed descriptions listed above are only specific descriptions of feasible implementations of the present invention, which are not intended to limit the scope of protection of the present invention. Any equivalent implementations or changes made without departing from the technical spirit of the present invention shall be included in the protection scope of the invention.

What is claimed is:

1. A method for preparing a semiconductor structure, comprising:
   providing a substrate; and
   preparing a buffer layer on the substrate, wherein the buffer layer comprises a first buffer layer and a second buffer layer sequentially upwards from the substrate;
   wherein the first buffer layer and the second buffer layer are co-doped with a transition metal and an impurity;
   wherein in the first buffer layer, a concentration of the transition metal is $1\times10^{16}$ cm$^{-3}$~$1\times10^{20}$ cm$^{-3}$, and a doping concentration of the impurity is greater than $3\times10^{15}$ cm$^{-3}$ and less than the doping concentration of the transition metal;
   wherein a concentration of the transition metal in the second buffer layer gradually decreases, and the concentration of the transition metal drops to 0.5~2 times of a background concentration at a distance greater than or equal to 100 nm from an upper surface of the second buffer layer away from the substrate; and
   wherein in the second buffer layer, a doping concentration of the impurity is not greater than the doping concentration of the transition metal.

2. The method for preparing the semiconductor structure as claimed in claim 1, wherein a thickness of the first buffer layer is not greater than 5 μm.

3. The method of preparing the semiconductor structure as claimed in claim 1, wherein a thickness of the second buffer layer is not less than 0.2 μm.

4. The method for preparing the semiconductor structure as claimed in claim 1, wherein the transition metal is at least one of Ti, Cr, Mn, Fe, Co, Ni, Cu, Zn, Mo, Ag, and Cd.

5. The method for preparing the semiconductor structure as claimed in claim 1, wherein the impurity is C.

6. The method for preparing the semiconductor structure as claimed in claim 1, wherein the substrate comprises a semiconductor material, a ceramic material, or a polymer material.

7. The method for preparing the semiconductor structure as claimed in claim 1, wherein the semiconductor structure comprises a nucleation layer disposed between the substrate and the buffer layer.

8. The method for preparing the semiconductor structure as claimed in claim 7, wherein a material of the nucleation layer is at least one of AlN, GaN and AlGaN.

9. A semiconductor structure, comprising:
a substrate; and
a buffer layer formed on the substrate, wherein the buffer layer comprises a first buffer layer and a second buffer layer sequentially upwards from the substrate;
wherein the first buffer layer and the second buffer layer are co-doped with a transition metal and an impurity;
wherein in the first buffer layer, a concentration of the transition metal is $1 \times 10^{16}$ cm$^{-3}$~$1 \times 10^{20}$ cm$^{-3}$, and a doping concentration of the impurity is greater than $3 \times 10^{15}$ cm$^{-3}$ and less than the doping concentration of the transition metal;
wherein a concentration of the transition metal in the second buffer layer gradually decreases, and the doping concentration of the transition metal drops to 0.5~2 times of a background concentration at a distance greater than or equal to 100 nm from an upper surface of the second buffer layer away from the substrate; and
wherein in the second buffer layer, a doping concentration of the impurity is not greater than the doping concentration of the transition metal.

10. The semiconductor structure as claimed in claim 9, wherein the semiconductor structure comprises a nucleation layer disposed between the substrate and the buffer layer.

11. The semiconductor structure as claimed in claim 10, wherein a material of the nucleation layer is at least one of AlN, GaN and AlGaN.

* * * * *